United States Patent
Venu et al.

(10) Patent No.: US 11,113,164 B2
(45) Date of Patent: Sep. 7, 2021

(54) HANDLING ERRORS IN BUFFERS

(71) Applicant: ARM Limited, Cambridge (GB)

(72) Inventors: Balaji Venu, Cambridge (GB); Matthias Lothar Boettcher, Cambridge (GB); Mbou Eyole, Soham (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/641,387

(22) PCT Filed: Aug. 30, 2018

(86) PCT No.: PCT/GB2018/052450
§ 371 (c)(1),
(2) Date: Feb. 24, 2020

(87) PCT Pub. No.: WO2019/069042
PCT Pub. Date: Apr. 11, 2019

(65) Prior Publication Data
US 2020/0192775 A1    Jun. 18, 2020

(30) Foreign Application Priority Data

Oct. 5, 2017 (GB) .................................... 1716280

(51) Int. Cl.
*G06F 11/22* (2006.01)
*G06F 9/30* (2018.01)
(Continued)

(52) U.S. Cl.
CPC ...... *G06F 11/2236* (2013.01); *G06F 9/30043* (2013.01); *G06F 9/466* (2013.01);
(Continued)

(58) Field of Classification Search
CPC .. G06F 11/2236; G06F 9/30043; G06F 9/466; G06F 11/0772; G06F 11/1004;
(Continued)

(56) References Cited

U.S. PATENT DOCUMENTS

| 5,887,270 A | 3/1999 | Brant et al. |
| 6,996,117 B2 * | 2/2006 | Lee ........................ G06F 9/3885 370/412 |
| 2010/0268987 A1 * | 10/2010 | Clark .................... G06F 9/3867 714/16 |

FOREIGN PATENT DOCUMENTS

| DE | 196 39 613 | 8/1997 |
| EP | 0 292 206 | 11/1988 |

(Continued)

OTHER PUBLICATIONS

International Search Report and Written Opinion of the ISA for PCT/GB2018/052450 dated Nov. 16, 2018, 15 pages.
(Continued)

*Primary Examiner* — Yair Leibovich
(74) *Attorney, Agent, or Firm* — Nixon & Vanderhye P.C.

(57) ABSTRACT

A buffer (72), (74), (76), (60), (78), (20), (82-90) has a number of entries for buffering items associated with data processing operations. Buffer control circuitry (100) has a redundant allocation mode in which, on allocating a given item to the buffer, the item is allocated to two or more redundant entries of the buffer. On reading or draining an item from the buffer, the redundant entries are compared and an error handling response is triggered if a mismatch is detected. By effectively reducing the buffer capacity, this simplifies testing for faults in buffer entries.

18 Claims, 8 Drawing Sheets

(51) Int. Cl.
*G06F 9/46* (2006.01)
*G06F 11/07* (2006.01)
*G06F 11/10* (2006.01)
*G06F 11/16* (2006.01)
*G06F 11/18* (2006.01)
*G11C 7/10* (2006.01)

(52) U.S. Cl.
CPC ...... *G06F 11/0772* (2013.01); *G06F 11/1004* (2013.01); *G06F 11/167* (2013.01); *G06F 11/186* (2013.01); *G11C 7/1057* (2013.01); *G06F 2201/805* (2013.01)

(58) Field of Classification Search
CPC ................. G06F 11/167; G06F 11/186; G06F 2201/805; G06F 11/267; G11C 7/1057; G11C 29/12
USPC .......................................................... 714/30
See application file for complete search history.

(56) References Cited

FOREIGN PATENT DOCUMENTS

| | | |
|---|---|---|
| EP | 0 319 799 | 6/1989 |
| JP | WO2006/129356 | 12/2006 |

OTHER PUBLICATIONS

Combined Search and Examination Report for GB1716280.1 dated Apr. 5, 2018, 7 pages.

Sorin et al., "Safety Net: Improving the Ability of Shared Memory Multiprocessors with Global Checkpoint/Recovery", 29th Annual International Symposium on Computer Architecture (ISCA-29), May 25-29, 2002, 12 pages.

Examination Report for GB Application No. 1716280.1 dated Feb. 20, 2020, 13 pages.

* cited by examiner

HANDLING ERRORS IN BUFFERS

This application is the U.S. national phase of International Application No. PCT/GB2018/052450 filed Aug. 30, 2018 which designated the U.S. and claims priority to GB Patent Application No. 1716280.1 filed Oct. 5, 2017, the entire contents of each of which are hereby incorporated by reference.

The present technique relates to the field of data processing. More particularly it relates to error handling.

A data processing apparatus may be subject to random hardware faults, e.g. permanent faults caused by a short circuit or a broken via in an integrated circuit which may cause a bit of a storage element or a data path to be permanently stuck at 0 or 1 for example, or temporary faults such as bit flips caused by exposure to natural radiation or particles strikes. For some fields of use, for example in the automotive field where safety can be critical, to ensure functional safety a processor can be provided with error detection mechanisms for detecting errors and ensuring safe operation in the presence of such errors. One approach can be to duplicate the entire processor core and run two or more processors in a lockstep mode where each processor runs the same code and errors are identified by comparing the results of equivalent operations on the respective processors. However, this approach can be very expensive in terms of circuit area and power consumption, especially where the processor cores are relatively high-performance processors, and also as many interfaces on the respective processor cores may need to be compared to detect errors, this may require a significant amount of additional wiring. Another approach can be to provide software-based testing where periodically the main processing executed on a given processor core is interrupted to execute a test sequence of instructions which may be designed to probe whether storage elements or data paths of the processor core are functioning correctly. However, such software test suites can be difficult to design because a given processor core may have a number of micro-architectural design features which can vary significantly from core to core and which may not be invoked unless a specific set of circumstances arises, making it difficult to design sequences of instructions to probe every possible error which could arise in a microprocessor implementation.

At least some examples provide an apparatus comprising:
a buffer comprising a plurality of entries to buffer items associated with data processing operations performed by at least one processing circuit; and
buffer control circuitry having a redundant allocation mode in which:
when allocating a given item to the buffer, the buffer control circuitry is configured to allocate the given item to each entry of a set of N redundant entries of the buffer, where N≥2; and
when reading or removing the given item from the buffer, the buffer control circuitry is configured to compare the items stored in said set of N redundant entries and to trigger an error handling response when a mismatch is detected between the items stored in said set of N redundant entries.

At least some examples provide an apparatus comprising:
means for buffering, comprising a plurality of entries to buffer items associated with data processing operations performed by at least one means for processing; and
means for controlling, having a redundant allocation mode in which:
when allocating a given item to the means for buffering, the means for controlling is configured to allocate the given item to each entry of a set of N redundant entries of the buffer, where N≥2; and
when reading or removing the given item from the means for buffering, the means for controlling is configured to compare the items stored in said set of N redundant entries and to trigger an error handling response when a mismatch is detected between the items stored in said set of N redundant entries.

At least some examples provide a method comprising:
buffering items associated with data processing operations performed by at least one processing circuit in a plurality of entries of a buffer;
wherein when operating in a redundant allocation mode:
when allocating a given item to the buffer, the given item is allocated to each entry of a set of N redundant entries of the buffer, where N≥2; and
when reading or removing the given item from the buffer, the items stored in said set of N redundant entries are compared and an error handling response is triggered when a mismatch is detected between the items stored in said set of N redundant entries.

Further aspects, features and advantages of the present technique will be apparent from the following description of examples, which is to be read in conjunction with the accompanying drawings, in which:

FIG. 1 schematically illustrates an example of a data processing apparatus;

FIG. 2 schematically illustrates an example of a processor core having a number of buffers;

Figure 1:
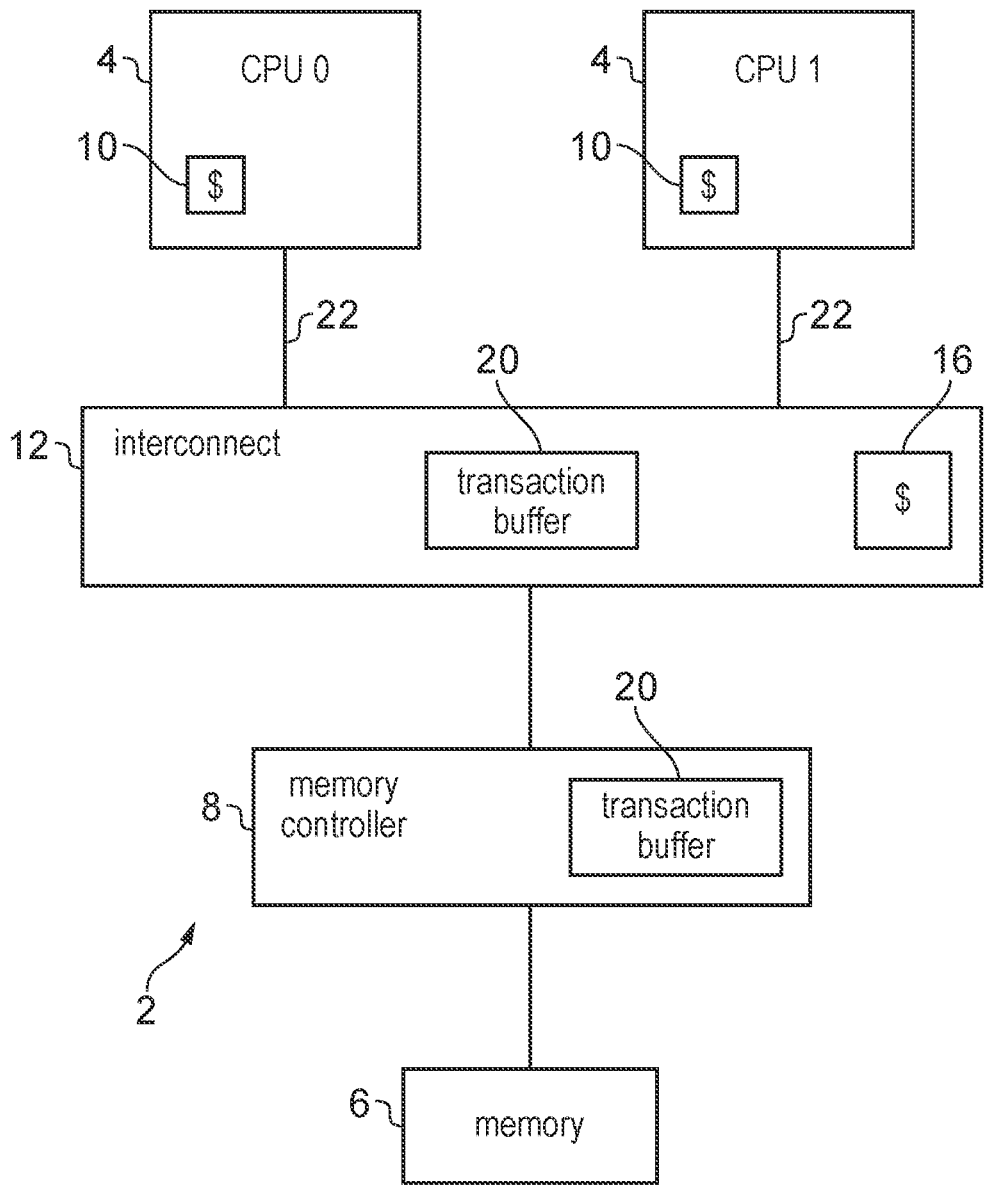

Buffers within a data processing apparatus, which buffer items associated with data processing operations performed by at least one processing circuit, can pose particular challenges for fault testing. Often, a buffer may be provided to buffer items while waiting for bandwidth or an opportunity to become available for processing the item, such as a slot on a bus for issuing a transaction, or a slot on an execution unit for executing an instruction. Typically the buffers may be sized to cope with the worst case demand expected on the buffer, but in practice the peak demand may not happen very often and so often the buffer may not be completely full (in fact to avoid loss of performance, the system is often intentionally designed to provide buffers of sufficient size that it is rare that the buffer becomes completely full). This means that some buffer entries may not be used very often and it can be difficult for software test suites or sets of redundant operations performed by the processing pipeline to generate enough demand to fully populate the buffer. This is particularly the case for buffers which lie outside the processor core, such as buffers in an interconnect or memory component. Another factor with items stored in buffers is that, unlike memory or cache storage where an address controls which data storage location is accessed, with a buffer the allocation of items to the buffer may often be dependent on the order in which items are supplied to the buffer and so it can be difficult for instructions executed by the processing circuit to influence which particular buffer entries are updated with items. This can make it difficult to generate a test algorithm which probes whether each location of the buffer is subject to an error. Hence, with existing fault testing techniques it can be difficult to adequately probe whether buffer entries have encountered errors.

As discussed below, buffer control circuitry may be provided having a redundant allocation mode in which, when allocating a given item to the buffer, the buffer control circuitry allocates the given item to each entry of a set of N redundant entries of the buffer, where N≥2, and when reading or removing the given item from the buffer, the buffer control circuitry compares the items stored in the set of N redundant entries and triggers an error handling response when a mismatch is detected between the items stored in the set of N redundant entries.

Hence, when in the redundant allocation mode, the buffer capacity is effectively reduced by a factor of N, so that each time an item is allocated to a buffer it is allocated redundantly to multiple entries of the buffer. Then, when reading or removing an item from the buffer, the items stored in the set of redundant entries can be compared and an error handling response triggered when a mismatch is detected. This reduces the number of items which need to be allocated into the buffer in order to fill the full occupancy of the buffer, which makes testing easier because it is less complex to design a set of test operations to fill fewer buffer entries. Nevertheless, the full capacity of the buffer can be tested since if an error occurs in any of the redundant entries then this can be detected by the comparison with other entries of the same set.

In one example, in the redundant allocation mode, the buffer control circuitry may allocate the given item to the N redundant entries in response to a single request to allocate the item to the buffer. Hence, it is not necessary for the processing circuitry, or other requesting entity, to generate multiple buffer allocation requests.

In one example, the apparatus may have self-test control circuitry to trigger at least one processing circuit to switch to a self-test state for executing a software self-test sequence of instructions. The technique of adding intra-buffer redundancy as discussed above can be particularly useful in systems which use software self-testing, because reducing the total number of distinct items which need to be allocated into the buffer in order to fully occupy all the entries of the buffer means that the self-test sequence of the instructions can often be significantly reduced in length and runtime because it is not necessarily to simulate as high utilisation for the buffer. By reducing the complexity of the software self-test sequence, this allows the software built in self-test (BIST) functionality to be implemented with less impact on the performance of the normal processing being carried out by the processing circuit, since it means that the window of time for which the normal processing is interrupted in order to perform the build in self-test sequence can be reduced.

An alternative to software BIST can be to use an intra-core lockstep mode in which the processing circuit may perform redundant processing operations within the same processor core and perform error detection in dependence on a comparison of an outcome of the redundant processing operations. For example, in response to a given instruction of a main thread of processing, the decoder of the processing pipeline could map the instruction to multiple distinct operations, one corresponding to the main processing and another corresponding to checker processing for checking the outcome of the main processing. While such intra-core lockstep modes may be effective in handling errors in registers or in execution units which actually generate the results of the processing operations, it may not be able to probe errors in some buffers because the utilisation of buffers may not map directly to particular processing operations. For example, with load/store operations it may not be practical to duplicate these and perform two load/store operations, and so the intra-core lockstep approach may not be used for load/store operations. In any case even if multiple identical load/store operations were issued in the intra-core lockstep mode, in practice data processing systems may have micro-architectural features for optimising performance by coalescing multiple load or store operations to the same address into a single operation, in order to reduce the memory bandwidth required, and so even if multiple loads or stores are issued this may not guarantee that multiple entries are allocated into a buffer in a cache or memory system. By using the approach discussed above where during the redundant allocation mode a given item to be allocated to the buffer is stored in multiple redundant entries, this makes it simpler to ensure that the buffer becomes fully occupied so that each location of the buffer can be tested for errors. Hence, the redundant allocation mode of the buffer control circuitry can complement the intra-core lockstep approach.

Nevertheless, intra-buffer redundancy can be used in any system in which error checking is desired. For example even if a processor core is fully duplicated in order to provide lockstep functionality, where each core redundantly executes the same program, there may still be some buffers which are shared between the multiple processors, and so for such buffers the redundant allocation of a given item to multiple entries can simplify testing and/or increase fault detection coverage.

In some embodiments, in addition to the redundant allocation mode, the buffer control circuitry may also have a normal mode in which, when allocating a given item to the buffer, the buffer control circuitry allocates the given item to a single entry of the buffer. As the redundant allocation mode effectively reduces the capacity of the buffer because there are now fewer distinct items which can be stored in the buffer, this may impact on performance and make it more likely that processing operations are delayed because of insufficient capacity in the buffer. By providing the normal mode as well then when it is important to maintain higher performance the normal mode can be selected, while the redundant allocation mode can be used at times when functional safety is considered more important. For example, in systems supporting a self-test state for executing a software self-test sequence of instructions, the buffer control circuitry could switch to the redundant allocation mode in response to entry of at least one processing circuit to the self-test state. The buffer control circuitry could then switch back to the normal mode in response to a return to previous processing following execution of the software self-test sequence of instructions. Hence, in some cases the redundant allocation mode may be enabled only during the software BIST mode. For example, an exception which triggers entry to the software self-test sequence could also trigger a switch to the redundant allocation mode.

In some examples the apparatus may have a configuration register which stores a programmable control parameter for controlling whether the buffer control circuitry operates in the redundant allocation mode or the normal mode. Hence, code executing on the processor can update the programmable control parameter to control whether the normal mode is used for higher performance or the redundant allocation mode is used for higher functional safety. In some cases the configuration register could include two or more separate programmable control parameters corresponding to different buffers within the apparatus, so that the redundant allocation or normal mode can be independently selected for each buffer.

Alternatively, in some examples, the buffer control circuitry could operate in the redundant allocation mode even when at least one processing circuit is in a functional state for executing instructions other than a software self-test sequence. Hence, the redundant allocation mode could be enabled even during processing of 'real' code (rather than during specific test sequences). For example, in some embodiments the buffer control circuitry could permanently operate in the redundant allocation mode so that there may not be any normal mode provided. In this case, either a performance hit may be acceptable compared to systems which do not use the redundant allocation mode, or if greater performance is required while still enabling redundant allocation mode, the data processing apparatus may be provided with additional buffer entries compared to an apparatus not having a redundant allocation mode so that the buffer is larger than it would normally have been, with the N-way redundancy providing the error handling capability. Hence, if the micro-architecture is such that some additional circuit area can be provided for the buffers then it is not essential to impact on performance in order to support the redundant allocation mode during the functional state. An advantage of using the redundant allocation mode during the functional state is that this enables transient errors in the buffer (such as bit flips caused by alpha particle strikes) to be detected, in addition to permanent errors (bits stuck at 0 or 1).

N, the number of entries to which a given item is redundantly allocated, can be any value greater than or equal to two. In some examples N may equal 2. This can be useful for limiting the performance impact of the use of the redundant allocation mode, since it allows for redundancy while enabling the greatest number of distinct items to be stored in the buffer for a given number of total entries provided in hardware. For example, in systems which enable the redundant allocation mode during functional processing of real code (rather than only using the redundant allocation mode during dedicating software BIST test modes), it may be preferred for N to equal 2 in order to reduce the performance impact. However, in other systems N could be larger, e.g. 4 or 8, which would have the advantage of reducing the complexity of designing test routines to fully populate the buffer.

In some cases, N could even equal the total number of entries of the buffer that are provided in hardware. Hence, the entire buffer could, during the redundant allocation mode, effectively correspond to one logical buffer entry so that only one item needs to be allocated to the buffer in order to completely fill the buffer and allow faults in any of the entries to be detected by the comparison between the items in the respective buffer entries. While it may seem counter-intuitive to effectively reduce the buffer capacity to one logical entry by providing complete redundancy, during test modes this can be beneficial since it greatly reduces the effort required to fill the buffer.

In summary, the value of N can be reduced or increased to trade off performance during regular processing against the overhead associated with testing. Different buffers within the system may operate with different values of N, so it is not essential for every buffer to use the same value.

The error handling response could take various forms. Although in some cases the error handling response could comprise triggering a reset of the system or flushing of instructions from the processing pipeline, in some cases the error handling response may simply comprise updating a status register to indicate that an error has been detected. For example, when running a software test algorithm, it may not be desirable to instantly trigger a reset each time an error is detected. Instead it may be preferable for the software test algorithm to complete and then at the end of the algorithm to check the status register to check whether any errors have been detected. In some cases, there may be multiple buffers and so the error handling response may comprise updating the status register to indicate which of the buffers encountered a detected error. Depending on which errors have been detected, the test instructions may then determine how to address the error (e.g. the particular locations, or quantity of the detected errors may determine the extent to which processing can continue).

In some examples, the apparatus may have error detecting code storage circuitry to store at least one error detecting code corresponding to at least one of the set of the redundant entries of the buffer. For example the error detecting code storage circuitry could be part of the buffer entries themselves or could be a separate storage element. When a mismatch is detected between the N redundant entries corresponding to a given buffer item, then the buffer control circuitry may detect which of the set of N redundant entries is an erroneous entry using the at least one error detecting code. Hence, by providing error detecting codes (such as parity codes or cyclic redundancy check (CRC) codes), it is possible not only to detect that one of the redundant entries is wrong, but also identify which of the set of the redundant entries is the erroneous entry. The error handling response could then comprise forwarding the item stored in one of the N redundant entries other than the erroneous entry for use in any subsequent processing. This approach can be particularly useful in cases where the redundant allocation mode of the buffer is used during processing of real code, since it may allow the real code to continue to make forward progress even when an error is detected.

The technique discussed above can be used with any buffer used within a data processing system. A buffer, which may also be referred to as a queue, may be used for temporarily storing items while waiting for some event to take place or for a slot to become available for accepting the item. A request to allocate an item to the buffer would not typically specify an address identifying the location of the buffer to which the items should be allocated, instead the buffer control circuitry may simply select which entry to use depending on current occupancy of the buffer and the order in which the item was received relative to other items. Also, items may be drained (removed) from the buffer without explicitly being requested to do so by the entity which requested allocation of the item to the buffer.

For example, the buffer could comprise an instruction queue to queue instructions processed by at least one processing circuit. For example, the instruction queue could be any queue of instructions within the processing pipeline, such as a decode queue for queueing instructions awaiting decoding, a rename queue for queuing instructions awaiting register renaming, an issue queue for queuing instructions awaiting operands to become available so that the instruction can be issued for execution, or a reorder buffer (or commit buffer) for queuing instructions which are still to be committed because they are dependent on earlier instructions which have not yet executed or are themselves not yet committed. It can often be difficult for a test algorithm to fully populate such buffers since the buffers are typically sized to cope with peak demands which would be difficult to simulate efficiently in a test routine while keeping the duration of the test routine as short as possible.

The buffer could also comprise a load/store queue to queue load/store transactions issued in response to instructions that are executed by at least one processing circuit.

Another example of a buffer may be a buffer within a cache, which may be used to queue at least one of: read requests to read data from the cache; store data to be written to the cache in response to a store transaction issued by at least one processing circuit; linefill requests requesting that data is read from a further cache or memory; linefill data read from the further cache or memory to be written to the cache; and writeback requests requesting that data read from the cache is written to the further cache or memory. Designing a test algorithm which fully probes errors in a cache's internal buffers can be difficult because the configuration of the cache and the size of the buffers may vary significantly from one design to another, so that a test algorithm for one processor design may not be suitable for another. Also, particularly for the final level of cache before the main memory, fully populating the buffers in that cache would often require a high volume of load/store transactions to different addresses to be generated in order to ensure that the load/store demand cannot be satisfied by lower level caches and sufficient requests to memory are generated to fully occupy the buffers in the final level cache. In practice, simulating that degree of load may often require a very long test algorithm which would delay the regular processing of the system and can consume more power in generating unnecessarily large numbers of memory operations. This problem can be avoided by redundantly allocating items to such buffers in caches during a redundant allocation mode so that less overhead is required in order to probe for errors.

In another example, the buffer may comprise a transaction buffer in a interconnect or a memory sub-system for buffering coherency transactions (such as snoop requests) or memory access transactions. Often the transaction buffer in the interconnect or memory sub-system may be shared between multiple processing circuits. In practice, completely filling the buffers in the interconnect or the memory sub-system may therefore require each of those processing circuits to operate at peak load. In practice, it may not be practical to design test operations in order to generate that volume of demand and this will have a significant impact on the regular performance of the data processing apparatus as a whole since it would require each of the processing circuits to stop their regular processing in order to generate memory transactions. This overhead can be avoided by using the redundant allocation mode discussed above.

FIG. 1 schematically illustrates an example of a data processing system 2 comprising a number of processing circuits 4, in this example two CPUs, which have access to data stored in memory 6. Memory controller 8 controls access to the memory 6. Each CPU has one or more internal caches 10 (although a single cache is shown for conciseness in FIG. 1, it would be appreciated that some processor cores may have multiple caches in a hierarchical structure). An interconnect 12 is provided to maintain coherency between data cached in the caches 10 of the respective processors 4. The interconnect 12 may operate according to a particular coherency protocol, for example using snoop transactions to ensure that when one processor reads a data value then it receives the most up to date version of the data, reflecting updates to the data at the same address made by other processor 4. The interconnect 12 may have a system cache 16 for caching data so that it can be accessed faster than if the corresponding data had to be fetched from main memory 6.

As shown in FIG. 1, the interconnect 12 and memory controller 8 may have a transaction buffer 20 for buffering coherency transactions or memory transactions while they are awaiting to be processed. For example snoop transactions or other coherency transactions may be queued in the transaction buffer 20 while awaiting slots on a bus 22 between the interconnect 12 and the processor 4 or while awaiting a response from one of the processors 4. Also, memory transactions could be buffered in the buffer 20 in the memory controller 8 while awaiting sufficient bandwidth to become available for accessing memory 6. In practice, the memory sub-system lying beyond the interconnect 12 could include a number components for handling memory transactions (the diagram in FIG. 1 showing only a memory controller 8 is simplified for conciseness), and so in practice there may be multiple such buffers 20.

Figure 2:
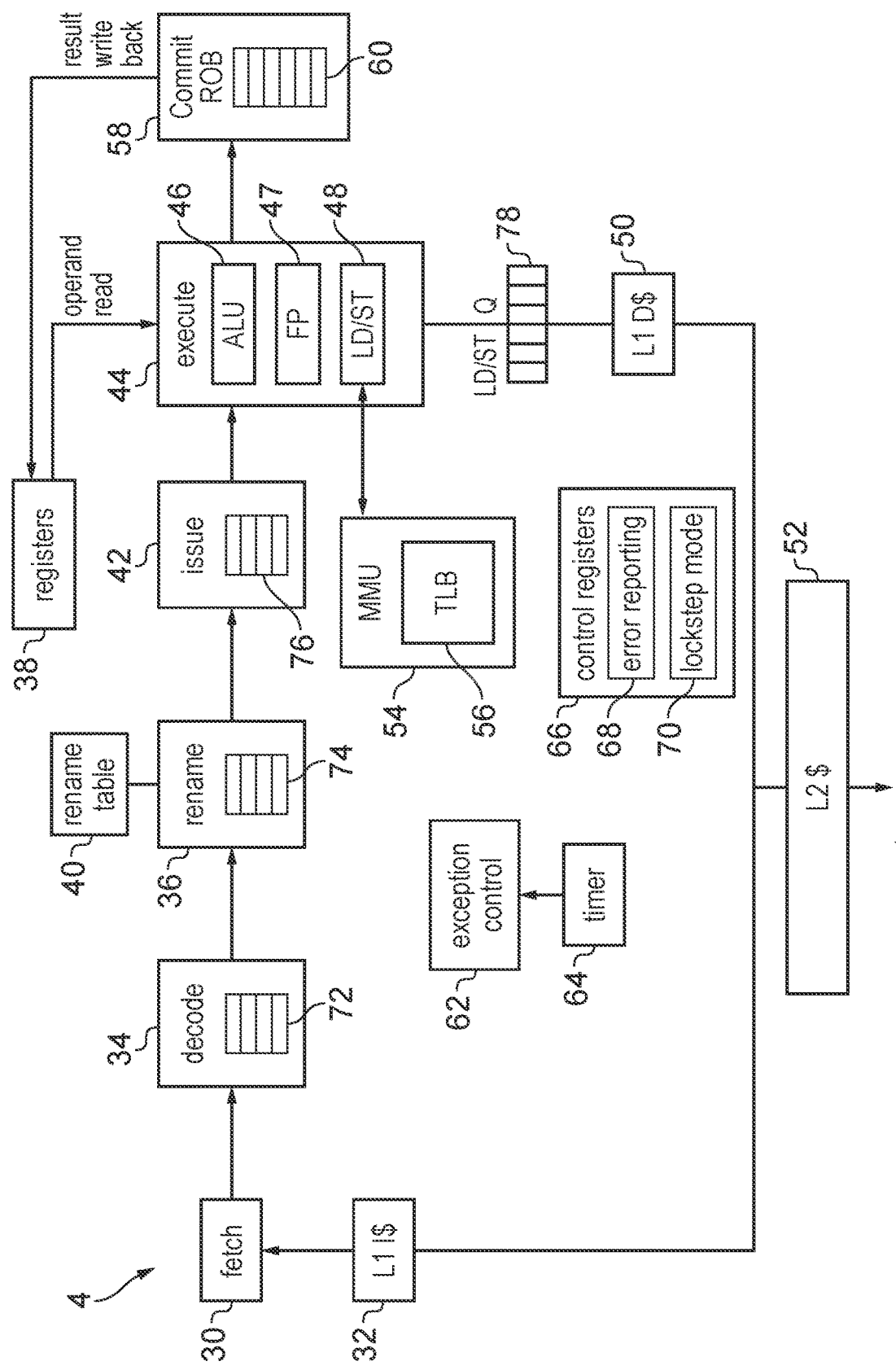

FIG. 2 shows in more detail an example of one of the processor cores 4. The processor core 4 comprises a processing pipeline comprising a number of pipeline stages for handling instructions. In this example the pipeline includes a fetch stage 30 for fetching instructions from an instruction cache 32, a decode stage 34 for decoding the instructions fetched by the fetch stage 30 to generate control signals for controlling remaining stages of the pipeline to execute the appropriate data processing operations, and a rename stage 36 for performing register renaming for mapping architectural register specifiers identified by the decoded instructions to physical registers 38 provided in hardware (a rename table 40 may be used to track the mapping of the architectural registers to the physical registers). The pipeline may also include an issue stage 42 for queueing instructions which are awaiting execution while their operands are being calculated, and issuing the instructions for execution once the operands are available, and an execute stage 44 which includes a number of execution units 46-48 for executing different types of processing operations in response to corresponding instructions. For example, FIG. 2 shows an example in which the execute stage 44 comprises an arithmetic/logic unit (ALU) 46 for executing arithmetic/logical operations, a floating point unit 47 for executing operations using floating-point operands, and a load/store unit 48 for handling load or store operations for accessing a cache or memory. In this example, the processor core includes a level 1 data cache 50, the level 1 instruction cache 32 and a level 2 cache 52 shared between the data and instructions. If data is not available within either of the level 1 caches or the level 2 cache, then a request is sent to main memory. It will be appreciated that this is just one example of a possible cache hierarchy, and in other examples further caches could be provided. Even if data is available within the processor core's internal caches 32, 50, 52, some transactions may still need to be sent to the interconnect 12 in order to maintain coherency with caches in other processors.

A memory management unit (MMU) 54 may be provided for handling translations of virtual addresses specified by the instructions processed by the pipeline into physical addresses used to identify locations within the memory system. The MMU 54 may include a translation lookaside buffer (TLB) 56 which acts as a cache for caching a subset of page table entries from main memory which define address translation mappings.

The pipeline also includes a commit stage 58 which controls writing back of results of the executed instructions to the register file 38. In this example the processing pipeline supports out of order execution and so the commit stage has a reorder buffer 60 for queuing executed instructions which are awaiting earlier instructions in the program order to complete execution or be committed, so that the results can be written back to the register file 38. That is, write back of a result of an executed instruction may be deferred until it is known that that instruction should have executed and any preceding instructions have also executed correctly. While FIG. 2 shows an example of an out of order processor, the techniques discussed herein can also be applied to in-order processors which may have a different pipeline configuration. For example in an in-order processor, the rename stage 36 could be omitted and the commit stage 58 could be replaced with a write back stage which simply writes back the results of the executed instructions in the order in which they are executed.

The processor 4 also includes exception control circuitry 62 for controlling handling of exceptions. For example the exception control circuitry 62 may respond to external interrupts or software-generated exceptions by interrupting processing of a current thread of execution on the processing pipeline and switching to execution of an exception handler. Some types of exceptions may be controlled based on a timer 64 which may periodically generate an exception signal to trigger the processing pipeline to carry out some action. The processor 4 may also include control registers 66 for storing various control parameters for controlling the operation of the pipeline. The control registers may include an error reporting register 68 specifying error status data and a register specifying a mode indicating value 70 as will be discussed below.

As shown in FIG. 2, a number of buffers may be provided in the pipeline for queuing instructions for operations to be performed. For example, the decode stage 34 may have a decode queue 72 for queuing instructions awaiting decoding, the rename stage may have a rename queue 74 for queuing instructions awaiting renaming and the issue stage 42 may have an issue queue 76 for queuing instructions awaiting issue for execution. Also the commit stage 58 may have the reorder buffer 60 as discussed above. The load/store unit 48 may also maintain a load/store queue 78 which may queue load/store transactions awaiting issue to the memory system or awaiting a response from the memory system. It will be appreciated that other queue structures could also be provided within the processor. Each buffer or queue may have a certain number of entries. While references are made in this application to buffering instructions, transactions, requests or other items in the buffer, it will be appreciated that this encompasses cases where the information actually stored in the buffer is not the instruction, transaction, request or item itself, but information related to the instruction, transaction, request or item, which could be in a different form to the item represented by that information.

Figure 3:
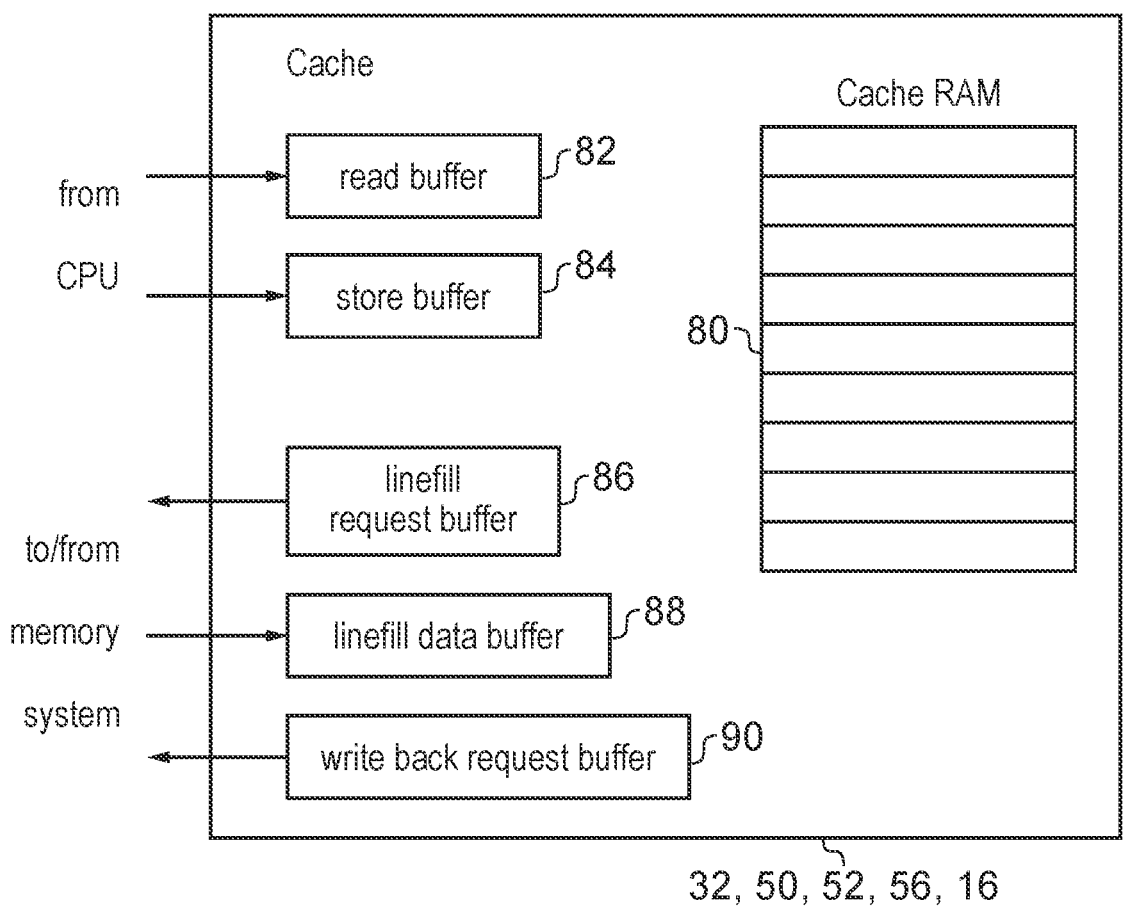
FIG. 3 shows an example of buffers included in a cache.

As shown in FIG. 3, the various caches of the processing system 2 (including not only the data or instruction caches 32, 50, 52 within the processor core 4, but also the TLB 56 for caching address translation data and any caches 16 within the interconnect 12 or memory system) may also include a number of buffers for buffering read or write requests or data awaiting to be written into the cache RAM storage 80 which actually stores the cache data. For example the cache buffers may include a read buffer 82 which buffers read requests requesting that data is read from the cache while the read requests are awaiting to be serviced by the cache RAM 80, and/or a store buffer 84 for caching store requests for storing data to the cache RAM 80 (including buffering the corresponding data to be written to the cache RAM 80). Also, the cache may include various buffers used for handling cache misses when the CPU 4 requests data from the cache but that data is not present within the cache and so needs to be fetched from memory. For example, such buffers may include a linefill request buffer 86 for buffering linefill requests to be issued to a further cache or the memory system 6 requesting that data is brought into the cache, a linefill data buffer 88 for buffering data which has been returned from the further cache or memory 6 in response to a line fill request but which has not yet been written into the cache RAM 80, and a write back request buffer 90 which buffers requests for data currently or previously stored in the cache RAM 80 to be written back to memory. For example, in a write through cache then any store request in the store buffer 84 which writes data into the cache RAM 80 may also trigger a corresponding writeback request to memory which may be temporarily buffered in buffer 90 while awaiting to be serviced. Alternatively, for a writeback cache the writing back of dirty data in the cache RAM 80 may be deferred until the data is evicted from the cache, and at this point a writeback request may be triggered. It will be appreciated that the buffers 82 to 90 shown in FIG. 3 are just one example, and other types of buffers could be provided, or some of these types of buffer omitted.

The onset of smarter and potentially semi-autonomous vehicles (cars, drones, etc.) represents a growing market for high performance processors. However, safety-critical systems require components to be certified to meet specific integrity levels. For instance the Automotive Safety Integrity Level (ASIL) risk classification scheme provides several levels of classification which vary in terms of the percentage of faults that can be detected. Processors focused on functional safety may be designed to include error detection mechanisms such as online logic built-in self-test, dedicated hardware checkers, etc., which can enable them to be classified at the highest classification level (ASIL D). However, application processors are more focused on performance within a general purpose environment and are less likely to support this degree of added complexity, as the cost and effort of including the error detection mechanisms would be infeasible for more complex higher-performance cores. However, if such a higher performance processor could be certified at a lower safety classification (e.g. ASIL B), then such processors could be combined with a smaller real-time processor for arbitration, to form a system complying with ASIL D, to enable higher performance in a safety-critical environment. Hence, it would be desirable to provide a technique for error detection which enables a higher performance processor to be classified for functional safety.

ASIL-B certification requires capability to detect 90% of stuck at faults (permanent faults causing a bitcell of a storage element to be stuck at 1 or 0 regardless of the value stored to that bitcell) in the CPU design (both flip flop and nets). Physical lockstep technology can provide 100% stuck at fault detection capability but incurs huge area and power overheads. Software BIST is a popular alternative where in test routines are developed to detect stuck at faults in the CPU design.

Figure 4:
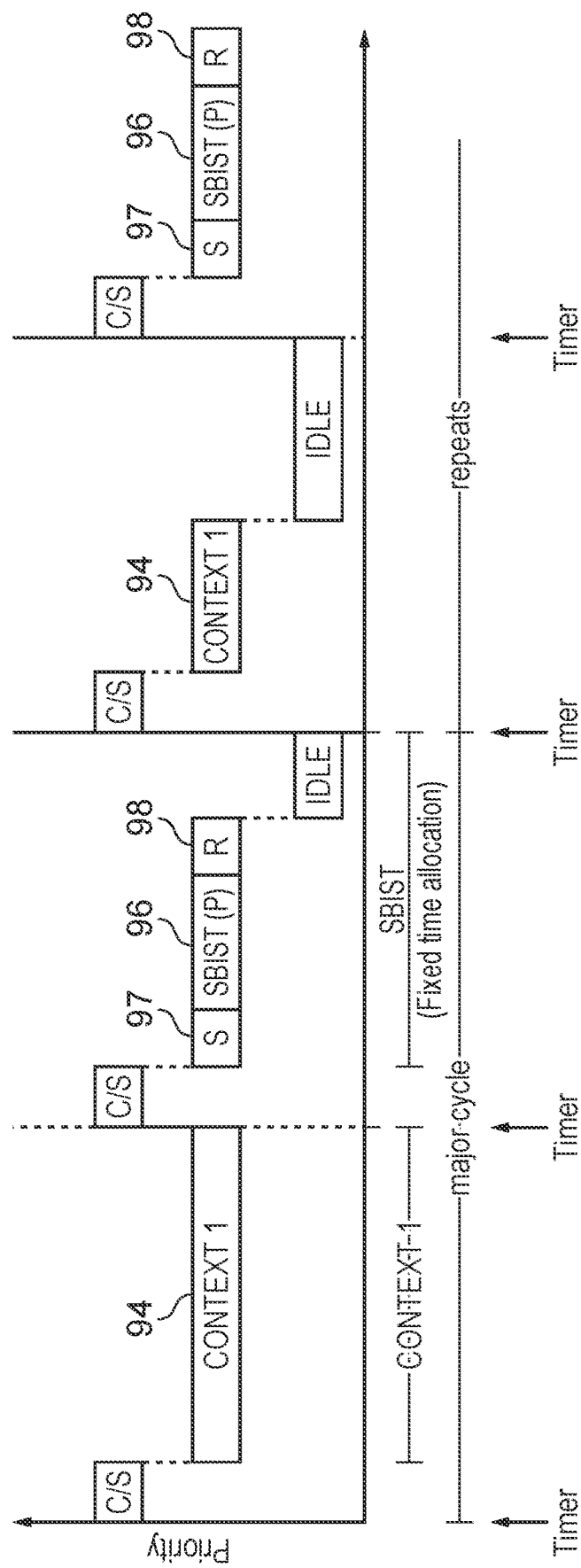
FIG. 4 illustrates an example of software built in self-testing.

The SW BIST library is expected to run periodically during functional mode of the CPU to detect any stuck at faults in the CPU. The library needs to be small in size (less code space) and execution run time must be kept to a minimum. FIG. 4 shows the timeline of executing SW BIST alongside an application 94 and details on the overheads involved for executing SW BIST. In the example, SW BIST routine 96 is executed periodically by interrupting the CPU. Prior to executing the SW BIST routine, all register state (General purpose & System Registers) of the CPU is saved (97) to memory because SW BIST is a destructive process. After the SW BIST routine is performed, the previously saved state is restored (98) to the registers 38. This can take over 2000 cycles on a typical microprocessor architecture. In case the execution run time of SW BIST ends up being very high, the tests can be split into chunks in order to meet real time guarantees of the application.

The test routine essentially will have two phases:

1. Trigger a stuck at fault to propagate to a "Point of observation".

2. Detect the propagated fault at the "Point of observation". The test suite usually checks for some status in memory at end of the test case to report "Fault detected" or "Fault not detected". Memory is the "Point of observation" for SW BIST, lockstep comparators is the "Point of observation" for physical lockstep technology. Developing SW BIST is highly time consuming and challenging because faults can easily get masked by the time it reaches the "Point of observation" which is usually memory in the case of SW BIST routines, and the test suite needs to be developed to detect Stuck at faults on the huge number of flip-flops and nets in the design in the CPU, e.g. many thousands of flip-flops and wires.

One of the problem points while developing SW BIST is covering stuck at faults in a memory interface unit or bus interface unit which interface the core to the rest of the memory system. These units have lots of buffers in them where data is held and coalesced before forwarding either to the memory system (STR transactions) or to the core (LD transactions). Covering stuck at faults in these buffer units would involve writing tests to fill up the buffers completely followed by hoping that the fault will propagate to the "Point of observation". There is significant challenge in filling up the buffers because the core will keep draining the transactions faster than the fill rate.

Figure 5:
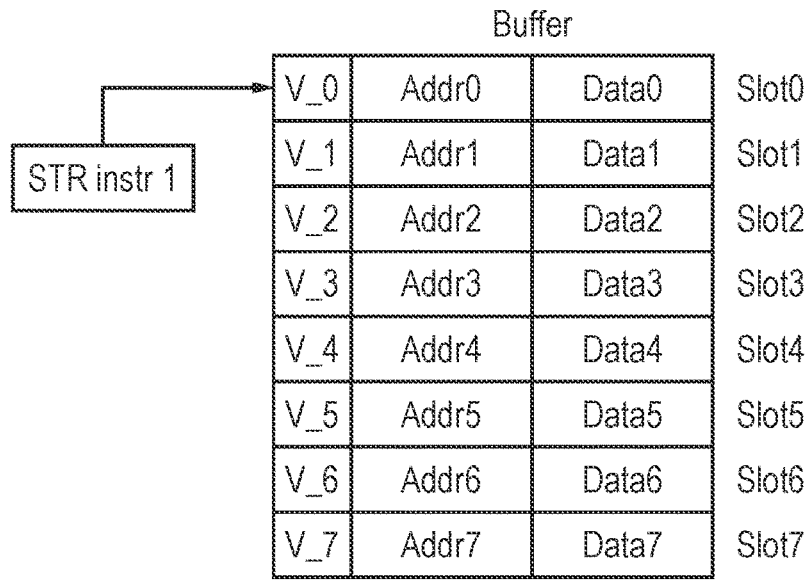
FIG. 5 shows an example of a buffer functioning in a normal mode.

FIG. 5 shows an example of operating a buffer in a normal mode of operation. In this case, when a request is made to store an item (e.g. an instruction, data value or transaction) to the buffer, then it is allocated to only a single entry of a buffer (which entry is used may be selected based on a current buffer occupancy or on the past history of allocations for example). When a downstream element is ready to accept the buffered item then it may read the item from the allocated buffer slot (without invalidating the buffered item), or may drain the buffered item from the buffer (reading the buffered item and removing it from the buffer by invalidating the corresponding buffer slot).

However, in order to test "stuck at" faults in the buffer structure, the buffer would need to be filled up completely and data read back from each entry. Usually, buffer micro-architectures are designed to drain items from the buffers as fast as possible which makes filling up the buffer completely a difficult task. This is particularly the case for transaction buffers 20 in the interconnect 12 or memory controller 8 which may be shared between multiple processors and may be designed to have a size that can cope with worst case workloads, or for buffers in caches as shown in FIG. 3, where for last level caches it may be rare that these buffers get completely filled during normal operation because most memory access transactions will normally be serviced by a lower level cache and so would not need to use the last level (e.g. level 3 or further) cache.

Figure 6:
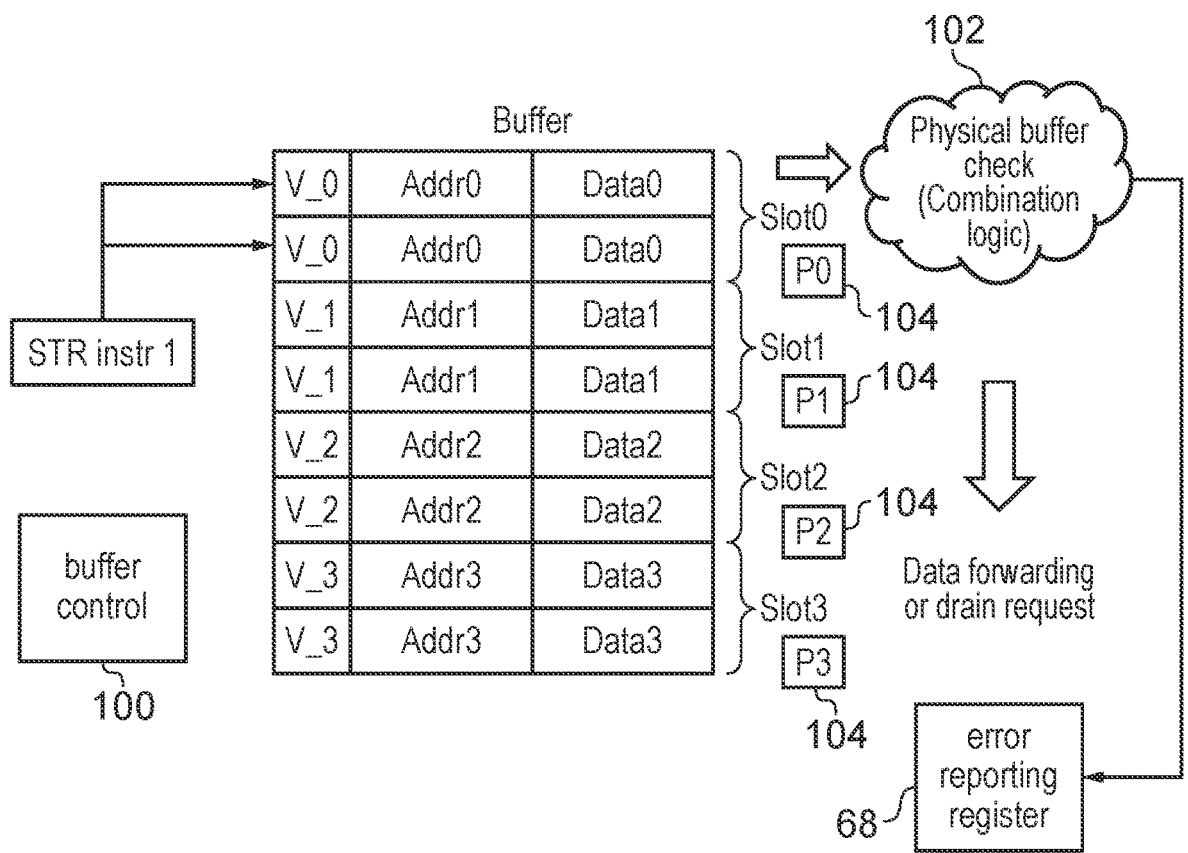
FIG. 6 shows an example of operating a buffer in a redundant allocation mode in which a given item is allocated to two or more redundant entries of the buffer.

As shown in FIG. 6, these problems can be addressed by operating the buffer in a redundant allocation mode in which the number of buffer entries is effectively reduced (without actually reducing the actual capacity of the buffer) by redundantly grouping buffer entries into logical slots corresponding to a certain number N of buffer entries, where N is 2 or greater. In the example FIG. 6 N=2 and so when a given item is allocated to the buffer then it is written to 2 entries of the same logical slot. That is, the same value is written to each of the redundant entries. When a read or drain request for reading or removing an item from the buffer is received, the buffer control circuitry 100 (having buffer check combination logic 102) compares the items stored in each of the N redundant entries within the same slot and checks whether each of the redundantly stored items is still identical. If there is a mismatch between the compared items in the N redundant entries then an error handling response is taken. For example the error handling response may comprise writing data to an error reporting register 68 within the control registers 66 of the processor core.

Hence, with the example of FIG. 6, software BIST algorithm only has to come up with a test to fill 4 buffer slots instead of 8 which enables shorter test sequences to be used and simplifies design of the test algorithm.

While FIG. 6 shows an example where N equals 2, other examples could operate with N being a greater number. For example N could equal 4 or 8. It is not essential for N to be a power of 2.

A particularly aggressive implementation could reduce the entire buffer to one logical location having many physical entries which operate in lockstep. Hence, in this case N may equal the total number entries in the buffer and so only one item needs to be allocated to the buffer in order to completely fill it and enable detection of a fault in any of the buffer entries. While this may come at the expense of increased combination logic within the logic 102 for checking whether all of the entries match, this will further simplify the software BIST algorithm needed. Hence, there may be a trade off between redundancy and circuit logic overhead.

In some cases it may be sufficient simply to be able to detect that an error has occurred somewhere in the buffer and it may not be important to know which particular buffer entry encounter the error. However in order to provide error pinpointing capability, each group of N redundant entries may be associated with error detecting codes 104, such as parity bits in the example of FIG. 6, which are computed based on the items placed in the corresponding entries when the items are allocated to the buffer and used on comparison of the items within the redundant slots to determine which particular buffer entry contains the error. For example, when N=2 it may be sufficient for one of the two redundant entries to have an associated parity bit (it is not required for both entries to have the parity bit), because when a mismatch is detected then the parity bit can be compared with a parity bit generated from one of the buffered values, and if the computed parity matches the stored parity value 104 then it can be deduced that the error is in the other entry of the redundant pair, while if the parity mismatches then the error is attributed to the entry having the parity bit associated with it. More generally, for a case in which N redundant entries are provided in the logical slot, then N−1 parity values or other types of error detecting code could be provided for all but one of the redundant entries.

The redundant allocation mode can be used in different use cases. In some cases the redundant allocation mode could be enabled only during the software built in self test mode. In this case performance of conventional code remains unchanged during the periods when no software testing is being performed. The provision of the redundant allocation mode significantly increases performance of the software test as the micro architectural buffers can be fully populated with a shorter sequence of test instructions and hence there is less run time for the software tests and therefore less impact on conventional code. An error reporting register 68 may be provided to record if any failure is detected in one of the buffers, and at the end of the software test the error reporting register 68 can be checked. In some cases the error reporting register 68 may include a number of different error status bits which indicate whether errors have been detected in two or more buffers in the system so that the location of the error can be identified and an appropriate response can be taken.

In other examples the redundant allocation mode for the buffer control circuitry 100 could be enabled even during a functional mode. Hence, even during running of regular code on the processor, the redundant allocation mode could still be used to detect errors occurring in buffers or queue structures. In this case, either an area hit can be taken so that additional entries can be provided in hardware in the buffer than would be the case if the redundant allocation mode was not provided, or alternatively an existing size of buffer can be partitioned into sets of redundant entries and this may incur a performance hit but with the benefit of increased error detection. When the redundant allocation mode is used for a buffer during functional processing of regular code, this provides an added advantage that there is soft error fault detection, since transient errors in buffers may then be detected.

Whether the buffer control circuitry 100 operates in the redundant allocation mode or the normal mode could be automatically controlled in response to certain events. For example when the exception control circuitry 62 (acting as self-test control circuitry) triggers a switch to the software BIST mode then this may automatically trigger the redundant allocation mode to be activated for the buffers. Alternatively, the mode configuration value 70 within the control registers 66 could be set by software in order to select whether to use the normal mode (for higher performance) or redundant allocation mode (for increased robustness against errors).

In summary, during buffer redundant allocation mode entries in internal queues/buffers can be split into groups, some for regular operation and some for lockstep. A write to the queue entry automatically updates a corresponding LockStep entry. A read from a queue entry or a retire automatically performs a comparison with a corresponding LockStep entry and updates the failure in a status register. Hence, upon a write operation, multiple physical slots are updated with the address and data values and the valid bits of the physical slots are set. Upon a read operation or a drain operation, there is an additional check done by comparing the values of all the fields of the redundant entries (valid, address and data).

Figure 7:
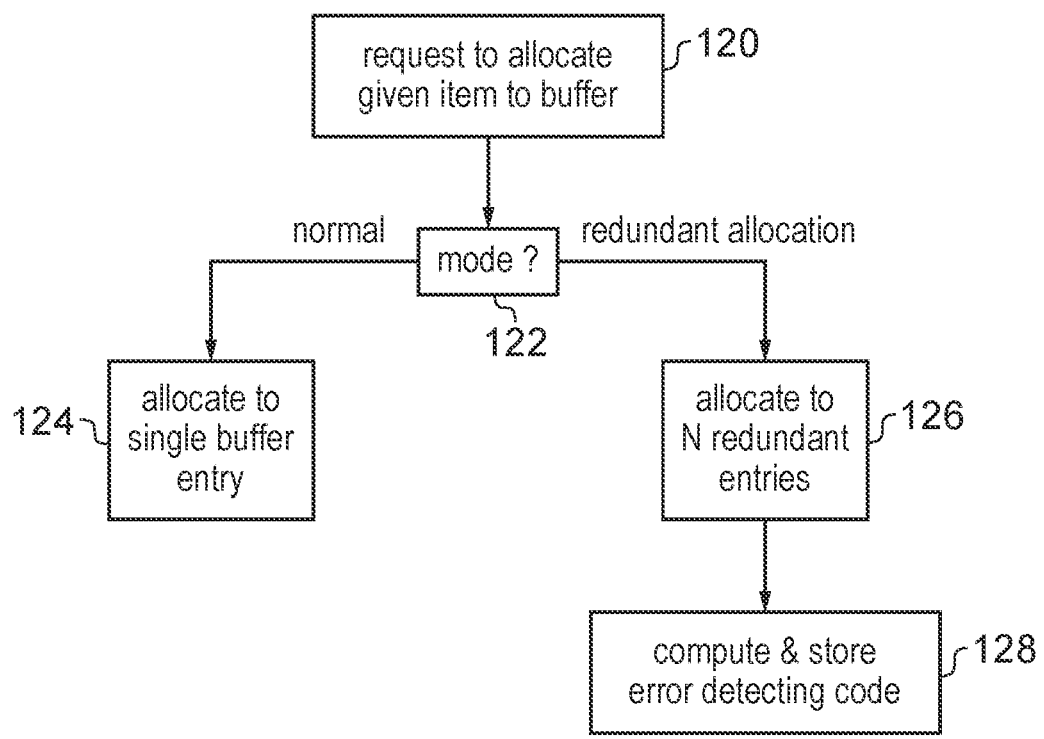
FIG. 7 is a flow diagram illustrating a method of allocating items to a buffer.

FIG. 7 is a flow diagram showing a method of controlling allocation of items into a buffer, which could be any of the types of buffer discussed above. At step 120 the buffer control circuitry receives a request to allocate a given item to the buffer. At step 122 it is determined whether the current mode of the buffer control circuitry 100 is the normal mode or the redundant allocation mode. For example, this could be determined with the reference to the mode selecting value 70 in the control register 66, which could be an internal register in the micro architecture which is not visible to software executing on the processing pipeline (e.g. the mode selecting value could be hardwired during manufacture of a given device), or could be a programmable register which is visible to the software so that the software can influence which mode is used. Alternatively, some embodiments may not support the normal mode and so could always operate in the redundant allocation mode.

If the current mode is the normal mode, then at step 124 the buffer control circuitry 100 allocates the given item to a single buffer entry of the buffer.

If the current mode is the redundant allocation mode then at step 126 the given item is allocated by the buffer control circuitry to a set of N redundant entries of the buffer, where N is 2 or greater. At step 128, optionally an error detecting code 104 is computed and stored in either the buffer entry itself or in a separate storage element. The error detecting code may be any type of code which enables an error in the stored value to be detected, for example a parity code or cyclic redundancy check (CRC) code. An error correcting code which provides additional redundancy to enable the correct value of the stored value to be recovered from only the stored value and CRC alone would not typically be needed because there is already redundancy in storing the given item to multiple locations, so that when an error is detected in one of the redundant buffer entries then the correct value can be determined from one of the other entries in the redundant set, with an error detecting code being sufficient to locate the error but not being needed to identify the correct stored value.

Figure 8:
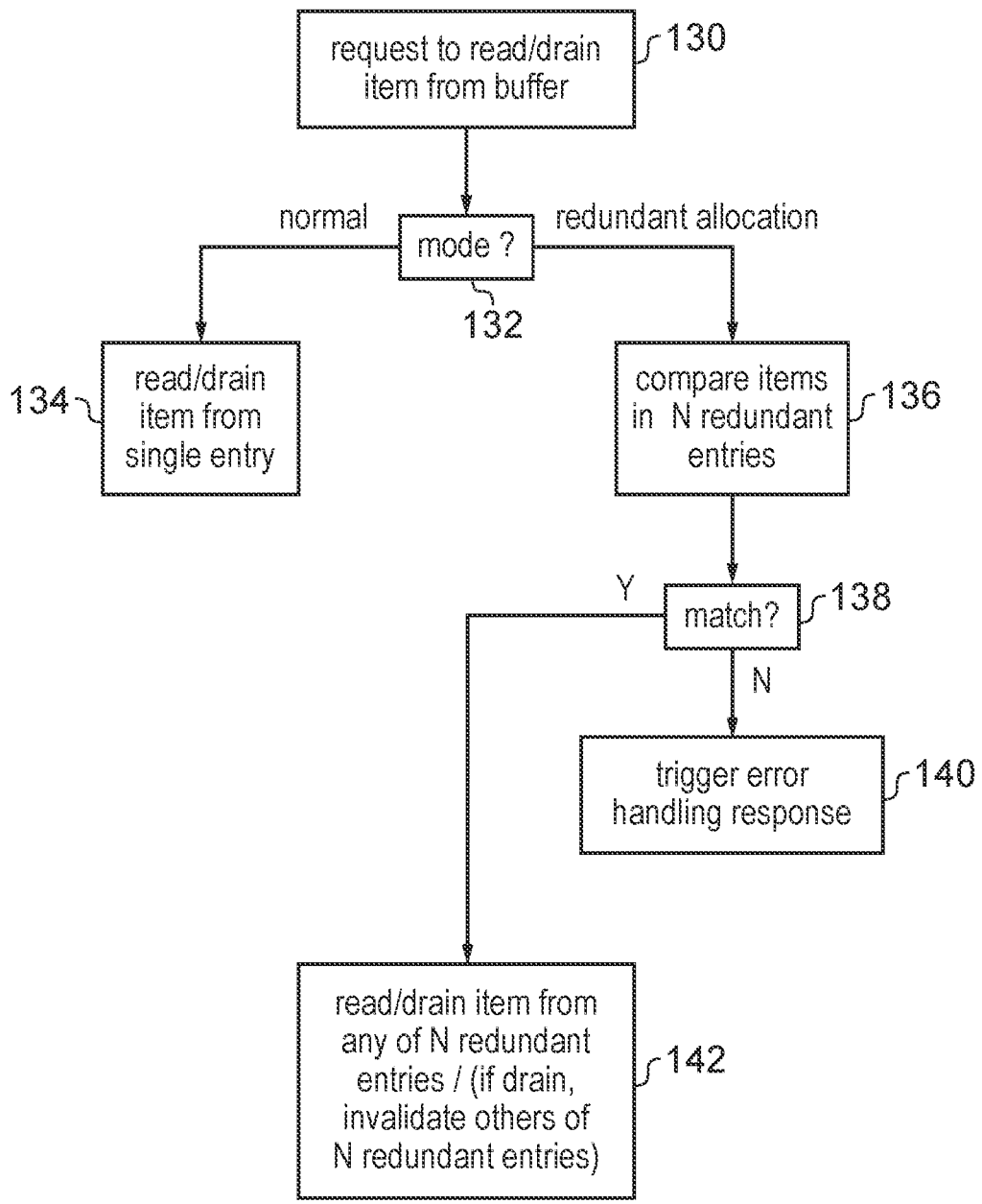
FIG. 8 is a flow diagram illustrating a method of reading or draining items from the buffer and detecting errors.

FIG. 8 is a flow diagram showing a method of reading or draining items from a buffer. At step 130 the buffer control circuitry receives a request to read or drain an item from a buffer. At step 132 the current mode of operation of the buffer is determined. If the buffer is in the normal mode then at step 134 the item is read or drained from single entry. For example, the buffer may have a pointer indicating the next item to be read or drained and so the item may be read from the buffer entry indicated by the pointer.

If the buffer is in the redundant allocation mode, at step 136 a given set of N redundant entries of the buffer is selected (again the set of entries to access could be selected based on a pointer for example). The items in the N redundant entries are compared and at step 138 it is determined whether the compared items match. If not, then at step 140 an error handling response is triggered. If the items match then at step 142 the item stored in any of the N redundant entries is read or drained and forwarded for subsequent processing by a downstream element. If the item is drained then all of the redundant entries are invalidated.

The error handling response at step 140 could vary but in some cases may comprise updating a status bit within the error reporting register 68 to indicate that an error occurred within a given buffer. Alternatively the error handling response could be more invasive, for example flushing some instructions from the pipeline or triggering a reset event.

Figure 9:
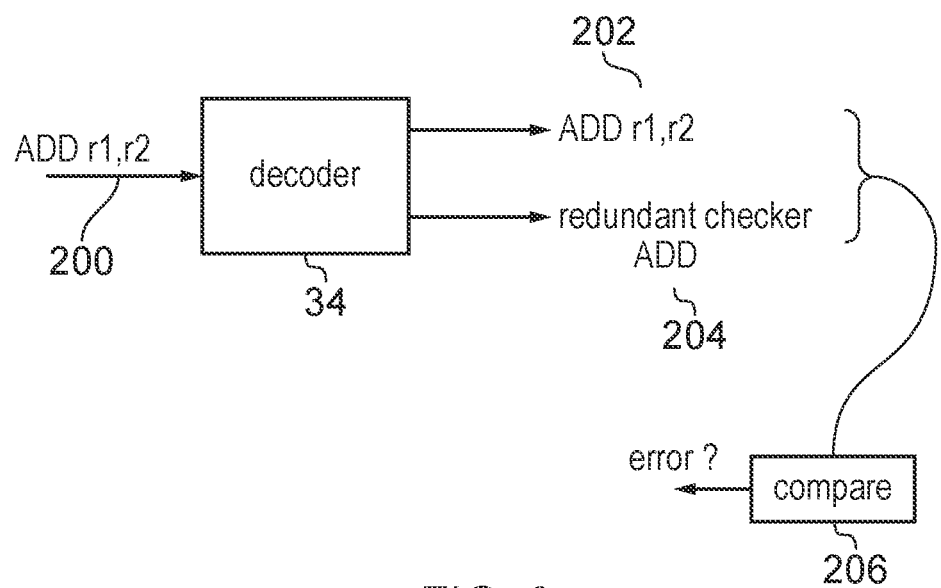
FIG. 9 illustrates an intra-core lockstep mode for executing redundant operations in the same processor core.

As discussed above the redundant allocation mode can be useful for a system supporting software GIST. However, it can also be useful in other forms of fault testing. For example, as shown in FIG. 9, an intra-core lockstep approach may be used in which the processing pipeline may perform multiple redundant operations corresponding to the main processing to be performed, so that the results of the redundant operations can be compared in order to identify any errors. For example, in response to a given instruction (e.g. an ADD) 200 the decode stage 34 of the pipeline could map this to a main operation 202 and a second redundant checker operation 204 which is intended to generate the same result as the main operation 202. Comparison circuitry 206 can then compare the results of the two operations 202, 204 and trigger an error handling response if a mismatch is detected. While FIG. 9 shows the decoder 34 supporting the splitting of the main instruction into multiple redundant operations, in other examples the compiler which compiles the software for execution on the pipeline could generate multiple redundant instructions so that the processing pipeline of the processor core itself does not need to do this splitting. Either way, the intra-core lockstep approach may not be able to duplicate every processing operation performed in response to a given program (for example it may not be practical to duplicate load/store instructions), and so the redundant allocation mode discussed above providing redundancy of buffer allocation can be useful for supplementing the error detection coverage achieved by the intra-core lockstep mode.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
a buffer comprising a plurality of entries to buffer items associated with data processing operations performed by at least one processing circuit; and
buffer control circuitry having a redundant allocation mode in which:
when allocating a given item to the buffer, the buffer control circuitry is configured to allocate the given item to each entry of a set of N redundant entries of the buffer, where N≥2; and
when reading or removing the given item from the buffer, the buffer control circuitry is configured to compare the items stored in said set of N redundant entries and to trigger an error handling response when a mismatch is detected between the items stored in said set of N redundant entries.

2. The apparatus according to claim 1, comprising self-test control circuitry to trigger at least one of said at least one processing circuit to switch to a self-test state for executing a software self-test sequence of instructions.

3. The apparatus according to claim 1, comprising at least one processing circuit supporting an intra-core lockstep mode in which the processing circuit is configured to perform redundant processing operations within a same processor pipeline and to perform error detection in dependence on a comparison of an outcome of the redundant processing operations.

4. The apparatus according to claim 1, wherein the buffer control circuitry has a normal mode in which, when allocating a given item to the buffer, the buffer control circuitry is configured to allocate the given item to a single entry of the buffer.

5. The apparatus according to claim 4, wherein the buffer control circuitry is configured to switch to the redundant allocation mode in response to entry of at least one processing circuit to a self-test state for executing a software self-test sequence of instructions.

6. The apparatus according to claim 5, wherein the buffer control circuitry is configured to switch to the normal mode in response to a return to previous processing following execution of the software self-test sequence of instructions.

7. The apparatus according to claim 4, comprising a configuration register to store a programmable control parameter for controlling whether the buffer control circuitry operates in the redundant allocation mode or the normal mode.

8. The apparatus according to claim 1, wherein the buffer control circuitry is configured to operate in the redundant allocation mode when the at least one processing circuit is in a functional state for executing instructions other than a software self-test sequence of instructions.

9. The apparatus according to claim 1, wherein the error handling response comprises updating a status register to indicate that an error has been detected.

10. The apparatus according to claim 1, comprising a plurality of said buffers, wherein the error handling response comprises updating a status register to indicate which of the plurality of buffers encountered a detected error.

11. The apparatus according to claim 1, comprising error detecting code storage circuitry to store at least one error detecting code corresponding to at least one of said set of N redundant entries, wherein when said mismatch is detected the buffer control circuitry is configured to detect which of the set of N redundant entries is an erroneous entry using said at least one error detecting code.

12. The apparatus according to claim 11, wherein the error handling response comprises forwarding the item stored in one of said N redundant entries other than said erroneous entry for use in subsequent processing.

13. The apparatus according to claim 1, wherein the buffer comprises an instruction queue to queue instructions processed by one of said at least one processing circuit.

14. The apparatus according to claim 1, wherein the buffer comprises a load/store queue to queue load/store transactions issued in response to instructions executed by one of said at least one processing circuit.

15. The apparatus according to claim 1, wherein the buffer comprises a buffer within a cache, to queue at least one of:
read requests to read data from the cache;
store data to be written to the cache in response to a store transaction issued by one of said at least one processing circuit;
linefill requests requesting that data is read from a further cache or memory;
linefill data read from the further cache or memory to be written to the cache; and
writeback requests requesting that data read from the cache is written to the further cache or memory.

16. The apparatus according to claim 1, wherein the buffer comprises a transaction buffer in an interconnect or memory sub-system to buffer coherency transactions or memory access transactions.

17. The apparatus according to claim 1, wherein the buffer is shared between a plurality of processing circuits.

18. A method comprising:
buffering items associated with data processing operations performed by at least one processing circuit in a plurality of entries of a buffer;
wherein when operating in a redundant allocation mode:

when allocating a given item to the buffer, the given item is allocated to each entry of a set of N redundant entries of the buffer, where $N \geq 2$; and when reading or removing the given item from the buffer, the items stored in said set of N redundant entries are compared and an error handling response is triggered when a mismatch is detected between the items stored in said set of N redundant entries.

* * * * *